US009078350B1

(12) United States Patent
Phillips

(10) Patent No.: US 9,078,350 B1
(45) Date of Patent: Jul. 7, 2015

(54) PORTABLE ARRANGEMENT FOR SUPPORTING PERSONAL COMPUTING/COMMUNICATING DEVICE

(71) Applicant: Roderick L. Phillips, Hughesville, PA (US)

(72) Inventor: Roderick L. Phillips, Hughesville, PA (US)

( * ) Notice: Subject to any disclaimer, the term of this patent is extended or adjusted under 35 U.S.C. 154(b) by 0 days.

(21) Appl. No.: 14/669,648

(22) Filed: Mar. 26, 2015

Related U.S. Application Data

(63) Continuation of application No. 13/779,845, filed on Feb. 28, 2013, which is a continuation-in-part of application No. 13/102,196, filed on May 6, 2011, now abandoned.

(60) Provisional application No. 61/332,217, filed on May 7, 2010.

(51) Int. Cl.
*F16M 13/02* (2006.01)
*H05K 5/02* (2006.01)
*H05K 5/00* (2006.01)

(52) U.S. Cl.
CPC ............ *H05K 5/0204* (2013.01); *H05K 5/0086* (2013.01); *F16M 13/022* (2013.01); *F16M 13/02* (2013.01)

(58) Field of Classification Search
CPC ..... F16M 13/02; F16M 13/00; F16M 13/022; F16M 11/10; F16M 11/24; F16M 11/2014; F16M 11/041; F16M 11/04; Y10S 248/918; H05K 5/0204; H05K 5/0086
USPC ........... 211/26; 312/277, 281; 108/42, 97, 98; 248/346.01, 229.2, 231.71, 235, 316.1, 248/250, 447.2, 245, 247, 316.8, 689, 248/454–457, 447.1
See application file for complete search history.

(56) References Cited

U.S. PATENT DOCUMENTS

| | | |
|---|---|---|
| 160,044 A | 2/1875 | Wilson |
| 606,514 A | 6/1898 | Carrier |
| 1,026,506 A | 5/1912 | Hard |
| 1,282,489 A | 10/1918 | Strodel |
| 2,017,518 A | 10/1935 | Wagner |
| 2,312,955 A | 3/1943 | Cambum |
| 2,374,409 A | 4/1945 | Brennan |
| 2,947,333 A | 8/1960 | Johnson |
| 3,647,078 A | 3/1972 | Fortunato |
| 3,741,131 A | 6/1973 | Leadbetter |
| 3,949,880 A | 4/1976 | Fortunato |
| 4,269,381 A | 5/1981 | Harms |
| 4,323,214 A | 4/1982 | DeLuca |
| 4,503,981 A | 3/1985 | Coronado |
| 4,511,111 A | 4/1985 | Godfrey et al. |
| 4,553,728 A | 11/1985 | Corsello |

(Continued)

*Primary Examiner* — Patrick Hawn
(74) *Attorney, Agent, or Firm* — GrayRobinson, PA

(57) ABSTRACT

A portable holder for removable attachment to a shelf is proposed, the portable holder for supporting an electronic device (such as, for example, a tablet, cell phone, e-reader or the like). The portable holder comprises a central support member for supporting the electronic device, a device retaining element coupled to a lower edge of the central support member and an upper attachment means coupled to a top edge of the central support member. The upper end termination is used to removably attach the portable holder to a shelf, and the holder is particularly formed to allow for the viewing angle of the device to be modified, as desired by the user. In one arrangement, the holder can be rotated while attached to the shelf, so as to be located in a preferred direction for the user.

8 Claims, 18 Drawing Sheets

(56) References Cited

U.S. PATENT DOCUMENTS

| | | |
|---|---|---|
| 4,562,987 A | 1/1986 | Leeds et al. |
| 4,569,498 A | 2/1986 | Ermanski |
| 5,288,042 A | 2/1994 | Grimm |
| 5,317,977 A | 6/1994 | Omessi |
| 5,590,607 A | 1/1997 | Howard |
| 5,607,135 A | 3/1997 | Yamada |
| 5,975,469 A | 11/1999 | Chen |
| 6,246,573 B1 | 6/2001 | Khan et al. |
| 6,357,703 B1 | 3/2002 | DiOrio |
| 6,619,609 B2 | 9/2003 | Cress |
| 7,007,912 B1 | 3/2006 | Giuliani et al. |
| 7,124,988 B1 | 10/2006 | Duffy et al. |
| 7,214,988 B2 | 5/2007 | Tsao et al. |
| 7,335,147 B2 | 2/2008 | Jones et al. |
| 7,458,555 B2 | 12/2008 | Mastropaolo et al. |
| 7,870,753 B2 | 1/2011 | Marcy et al. |
| D632,117 S | 2/2011 | Gibbs |
| 8,015,929 B2 | 9/2011 | Tyner |
| 2001/0003961 A1 | 6/2001 | Hodge et al. |
| 2002/0084398 A1 | 7/2002 | Hensel |
| 2004/0007651 A1 | 1/2004 | Williams et al. |
| 2007/0057140 A1 | 3/2007 | Liou et al. |
| 2008/0029663 A1 | 2/2008 | Derry et al. |
| 2008/0165505 A1 | 7/2008 | McCoy et al. |
| 2010/0130107 A1 | 5/2010 | Yilmaz et al. |
| 2012/0138766 A1 | 6/2012 | Chen |
| 2012/0187056 A1 | 7/2012 | Hazzard et al. |
| 2013/0140413 A1 | 6/2013 | Bailey |
| 2014/0091193 A1 | 4/2014 | Simon |

PORTABLE ARRANGEMENT FOR SUPPORTING PERSONAL COMPUTING/COMMUNICATING DEVICE

CROSS-REFERENCE TO RELATED APPLICATION

This application is a continuation of U.S. application Ser. No. 13/779,845 filed Feb. 28, 2013 entitled "PORTABLE ARRANGEMENT FOR SUPPORTING PERSONAL COMPUTING/COMMUNICATION DEVICE" which is a continuation-in-part of U.S. application Ser. No. 13/102,196 filed May 6, 2011, which claims the benefit of U.S. Provisional Application No. 61/332,217, filed May 7, 2010. The foregoing applications are expressly incorporated herein by reference in their entirety to form part of the present disclosure.

TECHNICAL FIELD

The present invention relates to a holder for personal computing/communicating devices and, more particularly, to a portable holder that can be easily mounted on the shelf, providing sufficient support for the device, yet is able to be quickly and easily removed from the shelf and moved to another location.

BACKGROUND OF THE INVENTION

There are many environments today, such as hospitals, labs, classrooms, offices, homes, or the like, where laptop computers are used and the workspace designated for these devices may be insufficient, cluttered or otherwise not available.

In today's society, for example, many people utilize their laptop computers (hereinafter simply referred to as "laptops") in a kitchen setting. A chef can perform on-line research for recipes while cooking. A mother can use social networks while performing other kitchen chores. A stock broker can monitor trades, and a business person can check email while having breakfast. Laptops are becoming ubiquitous in medical offices or hospitals, where each examining room may include a laptop, the group of laptops then networked together to collect patient information in an efficient manner.

A laptop (or notebook, netbook or similar portable computing device) is a very expensive piece of equipment and needs to be protected from harmful elements in many of these settings; "clutter" on a counter in a residence (for example, in the kitchen) or medical building (for example, in a patient examining area) may result in contaminating or otherwise damaging a laptop. People who use laptops in these environments are often "on the move", and do not sit down and use their laptop at a fixed location. Indeed, sitting down to use a laptop may be uncomfortable, and leaning over a laptop may not be ergonomically correct.

U.S. Pat. No. 6,601,609 issued to D. R. Cress et al. on Sep. 16, 2003 discloses an apparatus for supporting articles above a "work surface" such as a counter. The Cress et al. apparatus comprises a wire metal bracket that is supported by a pair of braces that are permanently attached to the underside of a shelf (or other raised area). The braces hold the wire bracket in a manner such that the bracket can be rotated out of sight when not in use. This is required inasmuch as the bracket is permanently attached to the shelf. It is not presumed that the wire bracket of Cress et al. could support the weight of a conventional computer laptop. Moreover, the need to permanently attach the braces to a shelf for support is considered to limit the usefulness of the Cress et al. arrangement.

U.S. Pat. No. 7,124,988 issued to L. A. Duffy et al. on Oct. 24, 2006 discloses a "portable" device for supporting a load in a cantilevered disposition relative to a shelf, cabinet or the like. The Duffy et al. structure is a multi-component arrangement including a two-part, hinged bracing structure that reaches underneath a shelf and also extends outward therefrom. A separate metal bracket, attached along the hinge, contacts the top surface of the shelf to hold the arrangement in place. The various components are connected along a hinge that allows for them to pivot and "close" onto one another for storage purposes.

A wall-mounted arrangement for supporting a laptop computer in an environment such as a medical examination room is disclosed in U.S. Pat. No. 6,246,573 issued to E. Khan et al. on Jun. 12, 2001. While suitable for use with a laptop, the wall-mount structure of E. Khan et al. cannot be adapted for use with a shelf in a cabinet and is not portable.

For situations where a user desires to access a relatively small electronic computing/communication device (e.g., tablet, cell phone, e-reader, or the like), it may be desirable to be able to change the viewing angle, as well as the orientation of the device itself (i.e., between horizontal and vertical). Any of the "fixed" attachment arrangements of the prior art do not—and cannot—accommodate these desires.

Thus, a need remains in the art for a portable support system for a personal computing/communicating device that is simple in form and is capable of being removably attaching to a shelf in a wall-mounted cabinet or the like.

SUMMARY OF THE INVENTION

The need remaining in the prior art is addressed by the present invention, which relates to a holder for laptop computers and, more particularly, to a portable holder that can be easily mounted on the shelf, providing sufficient support for a laptop, yet is able to be quickly and easily removed from the shelf and moved to another location. More particularly, the present invention also relates to a holder for personal computing and/or communicating devices and, more particularly, to a portable holder that can be easily mounted on the shelf, providing sufficient support for the device, yet is able to be quickly and easily removed from the shelf and moved to another location.

In accordance with one embodiment of the present invention, a portable laptop holder comprises a base support tray upon which the laptop (or any other device) is placed, including a device retaining portion for holding the laptop in place. An upper end termination of the support tray includes an arrangement for removably attaching the tray to a standard shelf (such as in a wall-mounted cabinet, a bookshelf, tabletop, or the like). The device retaining portion may take the form of a lip (curved end) formed along the lower termination of the support tray, a non-skid surface material on portions of the tray, strap members surrounding the tray, or the like.

In one embodiment, the upper end termination of the tray may comprise an open C-channel, with one or more mounting screws passing through to facilitate attachment of the C-channel to the shelf, the mounting screws coming to rest against the underside of the shelf. In an alternative embodiment, a pair of corner support brackets are attached to the upper end termination of the support tray and engage with the sidewalls of the cabinet to fixedly hold the tray in place.

The tray itself may be formed of a single piece of material, or a plurality of separate pieces joined together. The tray may include one or more ribs for additional rigidity and/or ventilation holes. The tray may be fixed in size, or adjustable in both width and length. Various materials (including metals and plastics) may be used to form the portable laptop holder of the present invention.

In another embodiment, the present invention comprises a portable holder for removable attachment to a shelf, where the portable holder is used to support a relatively small electronic device (such as, for example, a tablet, cell phone, e-reader or the like). The portable holder comprises a central support member for supporting the electronic device, a device retaining element coupled to a lower edge of the central support member and an upper attachment means coupled to a top edge of the central support member. The upper end termination is used to removably attach the portable holder to a shelf, and the holder is particularly formed to allow for the viewing angle of the device to be modified, as desired by the user. In one arrangement, the holder can be rotated while attached to the shelf, so as to be located in a preferred direction for the user.

These and other attributes and aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION OF THE INVENTION

The present invention addresses the above concerns associated with using a laptop in a space-limited environment, such as a kitchen, medical examining room, or the like. In particular, the present invention is related to a portable laptop holder that may quickly and easily be attached to a shelf, allowing for the laptop to be positioned at a proper level for a user, yet remain removed from kitchen/medical appliances, counters, and other areas where damage to the laptop may occur.

Figure 1:
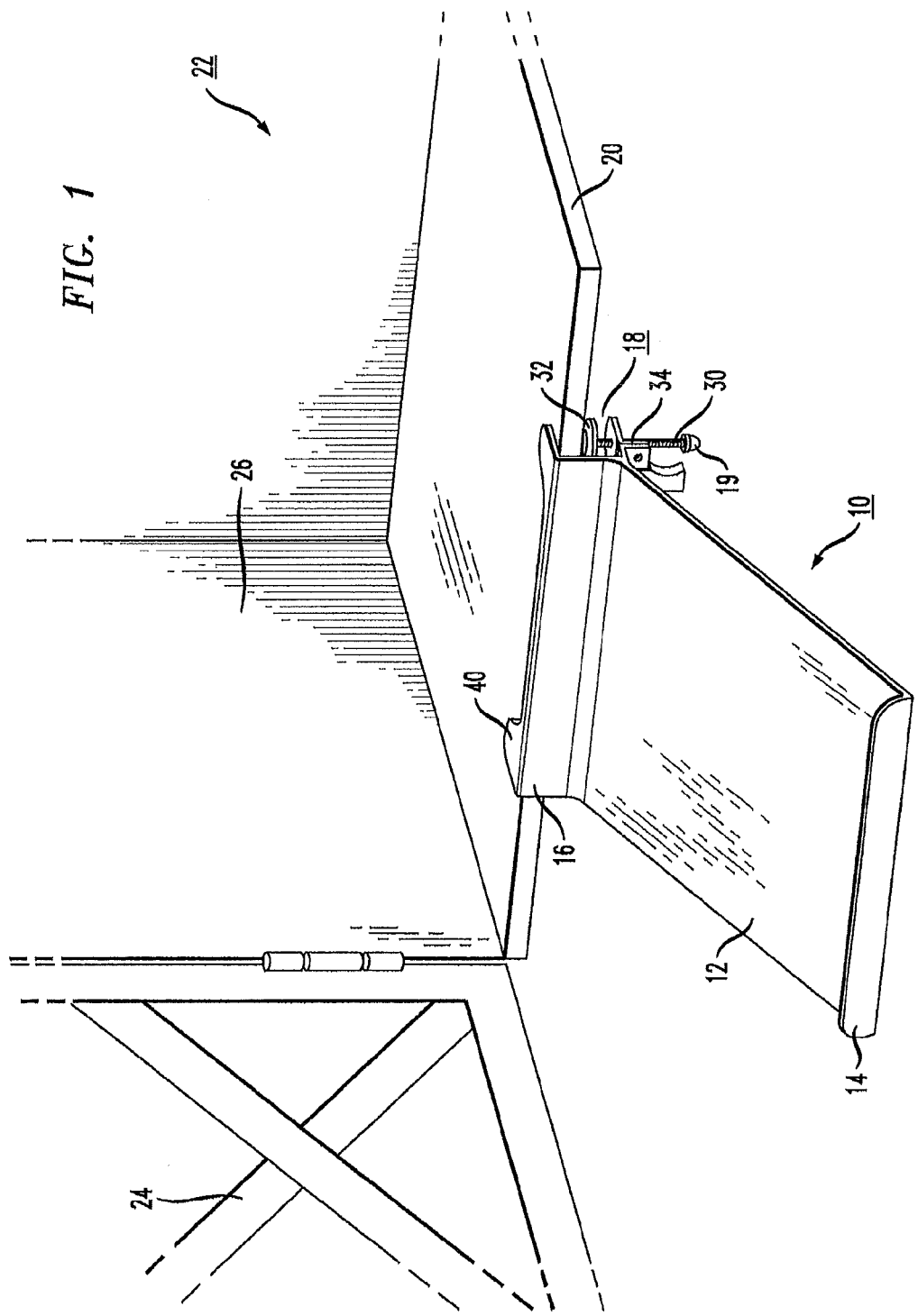
FIG. 1 is an isometric view of a portable laptop holder formed in accordance with the present invention.

FIG. 1 is an isometric view of a portable holder 10 formed in accordance with the present invention. It is an important aspect of the present invention that laptop holder 10 be completely portable, capable of hanging onto virtually any standard-sized cabinet without the use of any additional hardware or support elements. That is, there is no need to install any other shelving, brackets or support elements on the cabinets themselves. Holder 10 may therefore be taken by the user from one location to another and easily used with various cabinets, in any location or setting. It is to be understood that while most applications and the following examples are associated with using the portable holder with a wall-mounted cabinet, the inventive portable holder may be used with a bookshelf, wall-mounted shelf, tabletop, or any other flat surface.

Referring to FIG. 1, portable holder 10 is shown as fixed in position to a bottom shelf 20 of a wall-mounted cabinet 22. As shown, portable holder 10 comprises a tray portion 12 for supporting a laptop computer (or other electronic/communication device, book, papers, etc.) that terminates in a device retaining element 14 in the form of a lower lip that curves upward and functions as a "stop" to hold a laptop computer (or any other device) in place. Portable holder 10 further comprises an upper end termination 16 of tray 12 that engages with shelf 20 to secure portable holder 10 in place. When used with a wall-mounted cabinet, the relatively low profile of portable holder 10 allows for cabinet door 24 to be closed with holder 10 still in place.

In accordance with the present invention, upper end termination 16 includes attachment means 18 for removably attaching portable holder 10 to shelf 20. While various specific configurations may be used in the design of attachment means 18, it is important that the attachment be secure enough to fixedly support both holder 10 and a laptop positioned on the holder, yet be easy enough to "loosen" such that holder 10 can be quickly dismounted from the shelf and moved to another location (or stored away).

In the particular embodiment shown in FIG. 1, attachment means 18 comprises at least one bolt 19 disposed through a portion of upper end termination 16. Bolt 19 includes a threaded shaft 30, terminating in a head 32 for contacting the underside of shelf 20. A wing nut 34 is positioned along threaded shaft 30 underneath upper end termination 16 for controlling the movement of threaded shaft 30 with respect to upper end termination 16 and securing the engagement of head 32 with the underside of shelf 20. In particular, once upper end termination 16 is in place with respect to shelf 20, wing nut 34 is used to tighten head 32 in place against the underside of shelf 20 and prevent holder 10 from moving with respect to shelf 20. When holder 10 is no longer needed, wing nut 34 is loosened to release head 32 from shelf 20, allowing holder 10 to easily be removed. Using the threaded bolt as an attachment means allows for the thickness of various shelves to be easily accommodated. However, it is to be understood that attachment means may include a variety of other arrangements that may be quickly and easily used to removably secure holder 10 to shelf 20 (including, for example, latches, suction arrangements, or the like).

Figure 2:
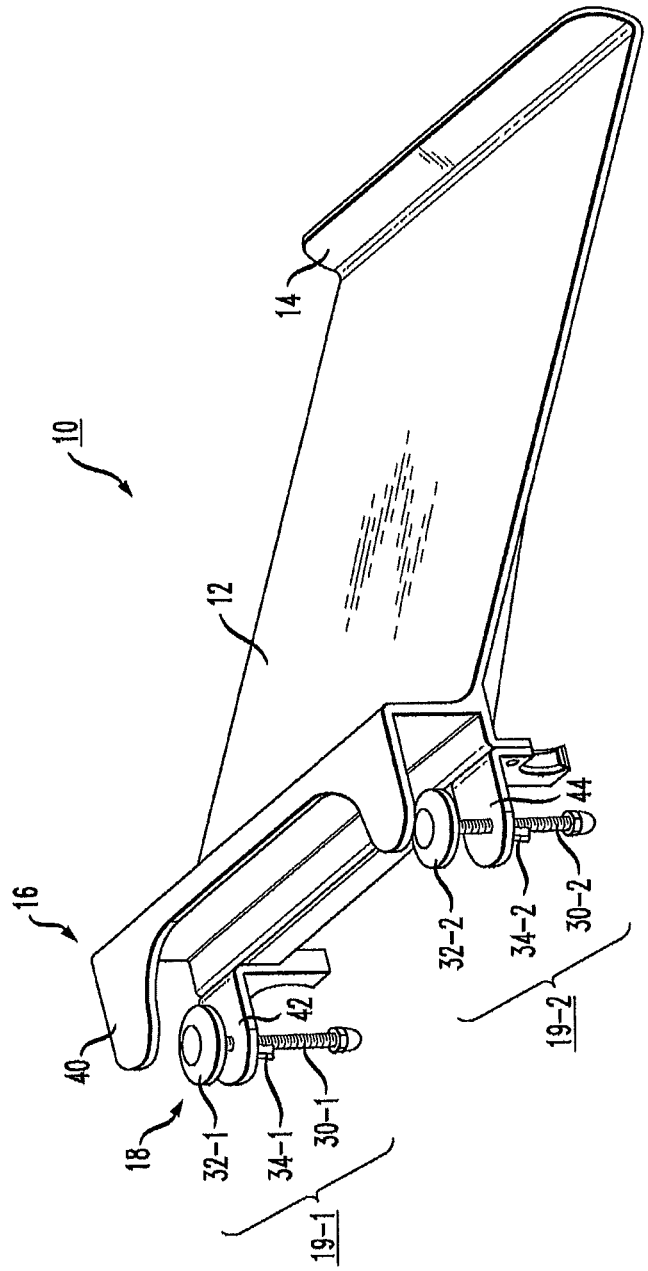
FIG. 2 is an alternative isometric view, showing the backside of the portable laptop holder of the present invention.

FIG. 2 is another isometric view of holder 10, showing in this case the use of a pair of bolts 19-1 and 19-2 disposed at either edge of upper end termination 16. Each bolt 19 is shown as including a threaded shaft 30, head 32 and wing nut 34 as described above. Also evident in this view is the formation of upper end termination 16 as an open C-channel (various other configurations are possible and considered to fall within the scope of the present invention). This specific configuration of upper end termination 16 is defined as including an engaging surface 40 that fits over the top of shelf 20 (see FIG. 1) and a pair of lower fixturing portions 42, 44, disposed at opposing edges of upper end termination 16. As shown in FIG. 2, a first threaded shaft 30-1 is disposed through fixturing portion 42 and a second threaded shaft 30-2 is disposed through fixturing portion 44. Bolts 19-1 and 19-2 are then tightened in the manner described above to secure holder 10 in place with respect to shelf 20.

Figure 3:
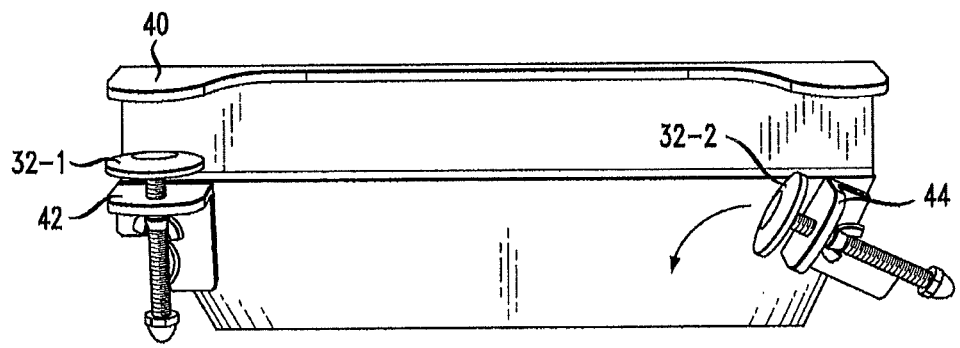
FIG. 3 is a rear view of a specific embodiment of the portable laptop holder of FIG. 1, illustrating the use of rotatable bolts for attaching the holder to a shelf.
Figure 4:
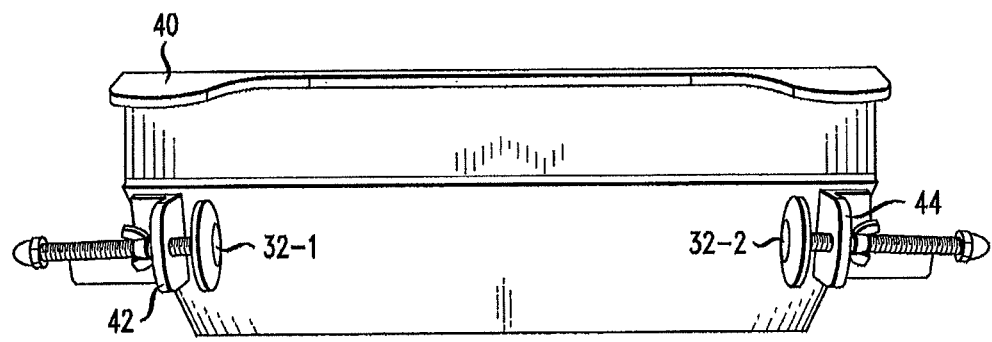
FIG. 4 is another review of the embodiment of FIG. 1, showing both bolts as rotated to their "open" position.

In one embodiment, lower fixturing portions 42, 44 may be formed as rotating members to facilitate the quick removal/installation of holder 10 with respect to shelf 20. FIGS. 3 and 4 illustrate the rotating movement of lower fixturing portions 42, 44 in a rear view of holder 10. As shown, lower fixturing portions 42, 44 are formed as separate members that rotate with respect to tray 12, where portions 42, 44 rotate inward to swing out of the way of the attachment process. FIG. 3 shows lower fixturing portion 44, including bolt 19-2, being rotated toward the interior of holder 10. FIG. 4 shows both lower fixturing portions 42, 44 in their fully inwardly rotated positions. In this position, therefore, holder 10 may be easily positioned along shelf 20 (not shown) and once in position, lower fixturing portions 42, 44 rotated upward to contact the underside of shelf 20.

Figure 5:
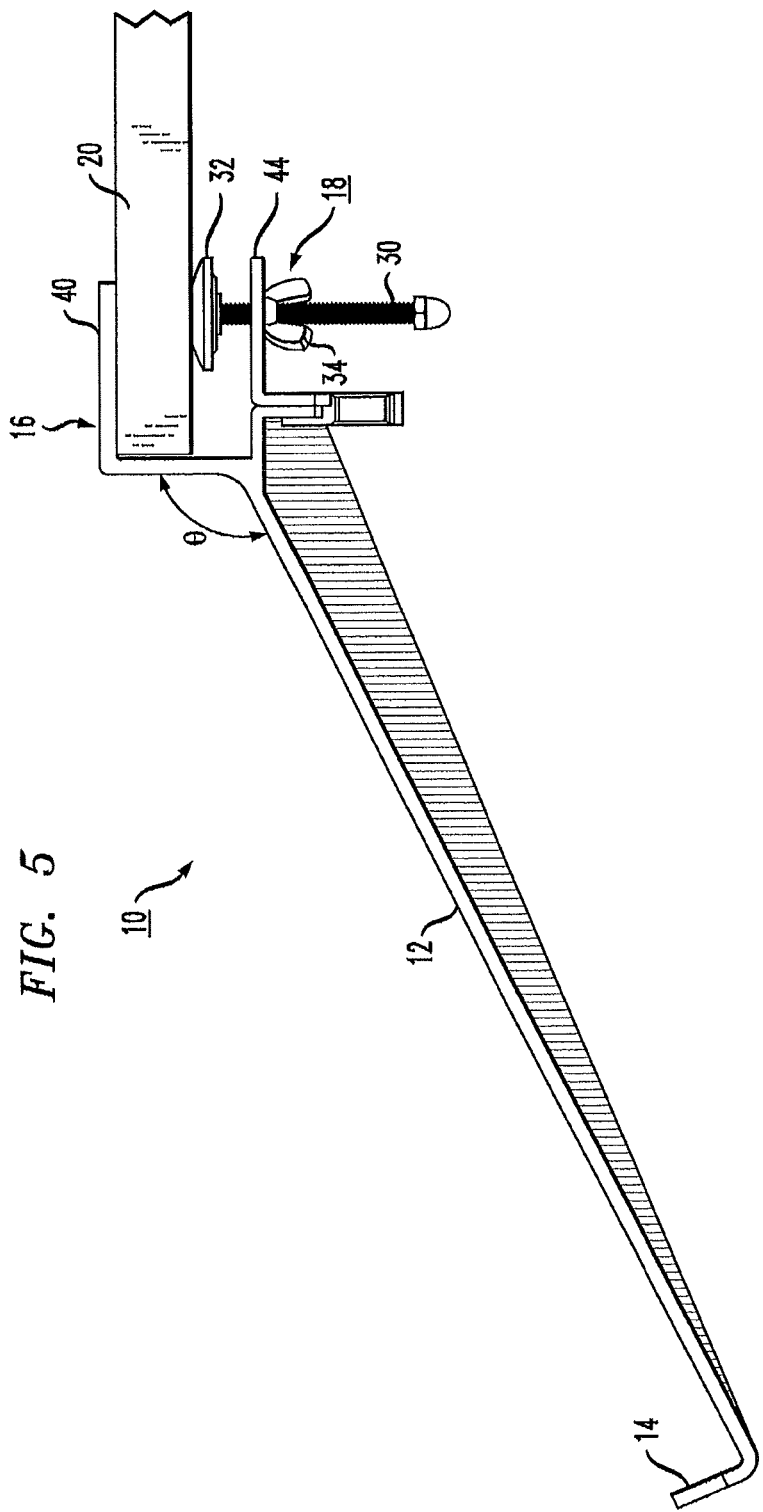
FIG. 5 is a side view of the portable holder of FIGS. 1 and 2.
Figure 6:
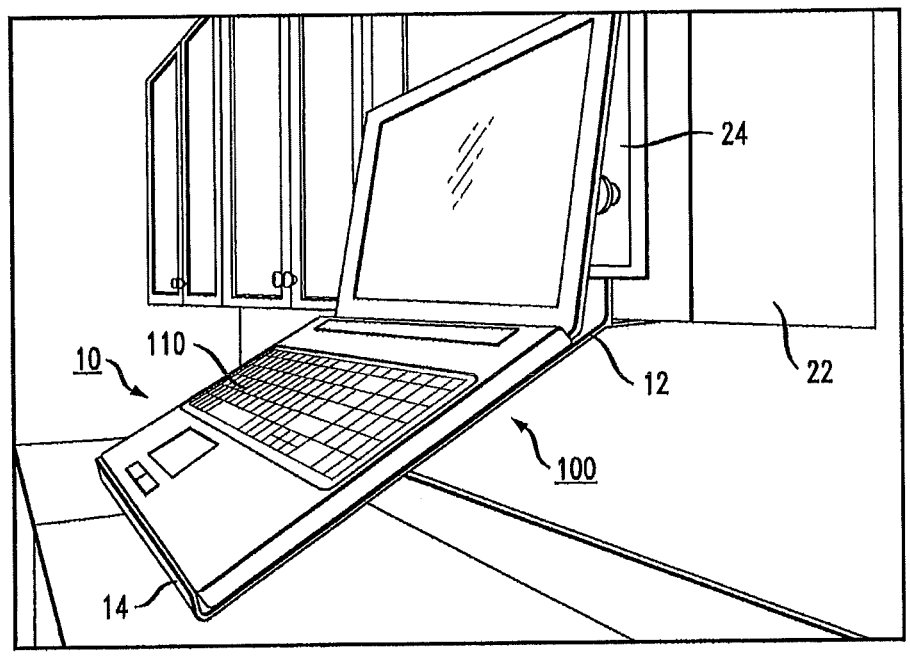
FIG. 6 is a side view of the inventive portable holder as mounted on a cabinet shelf, a typical laptop is shown as supported on the portable holder.
Figure 7:
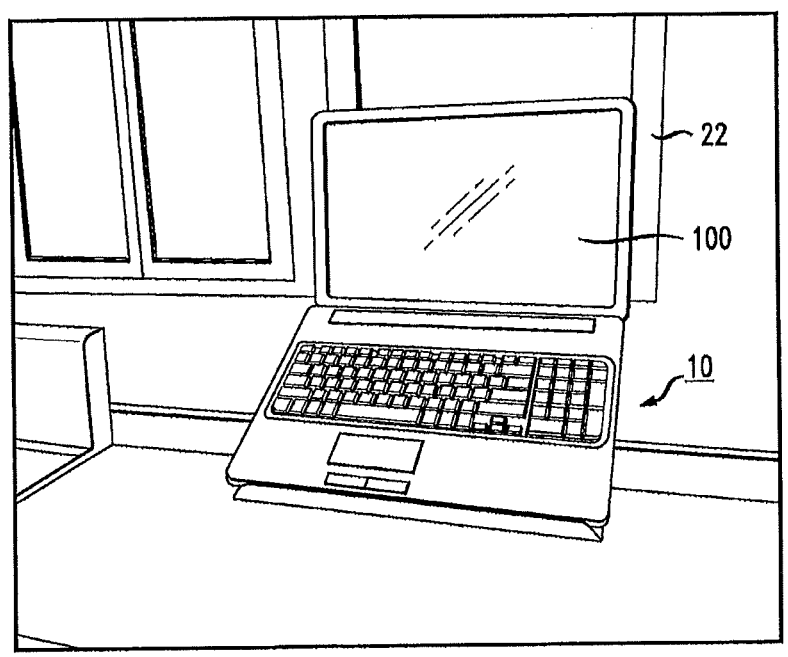
FIG. 7 is a front view of the arrangement of FIG. 6, illustrating the placement of a supported laptop computer above a countertop and away from any clutter or potential contaminants.
Figure 8:
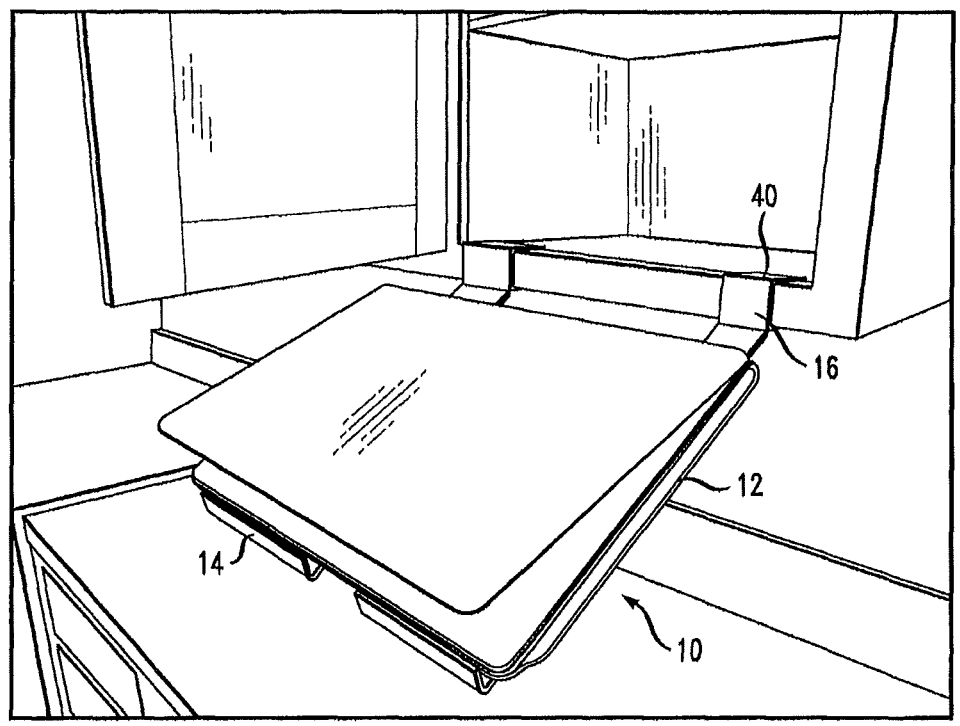
FIG. 8 is an isometric view of the arrangement of FIG. 6, with the laptop cover nearly closed and the cabinet door open, illustrating the engagement of the portable holder with a shelf in the cabinet.

Advantageously, tray 12 is angularly disposed with respect to upper end termination 16 so that when a laptop is positioned on tray 12 it is at a 'user-friendly' orientation. FIG. 5 is a side view of portable holder 10 illustrating the angular displacement θ between upper end termination 16 and tray 12. An angle of about 115° has been found useful; however, any angle in the range of about 100°-130° is considered appropriate for this use, the particular angle at the discretion of the designer. FIG. 6 is a side view of portable holder 10 as positioned in place along shelf 20 of cabinet 22 (with cabinet door 24 being closed and shelf 20 not visible in this view), showing the support of an exemplary laptop 100, with the angular displacement allowing for a comfortable use of the keyboard 110 of laptop 100. FIG. 7 is a front view of portable holder 10 as positioned within shelf 20 of cabinet 22 and supporting laptop 100 at a useful location, raised above the counter surface. FIG. 8 is an isometric view, with the cover of laptop 100 nearly closed and cabinet door 24 open, illustrating the engagement of upper end termination 16 with shelf 20 in cabinet 22.

Figure 9:
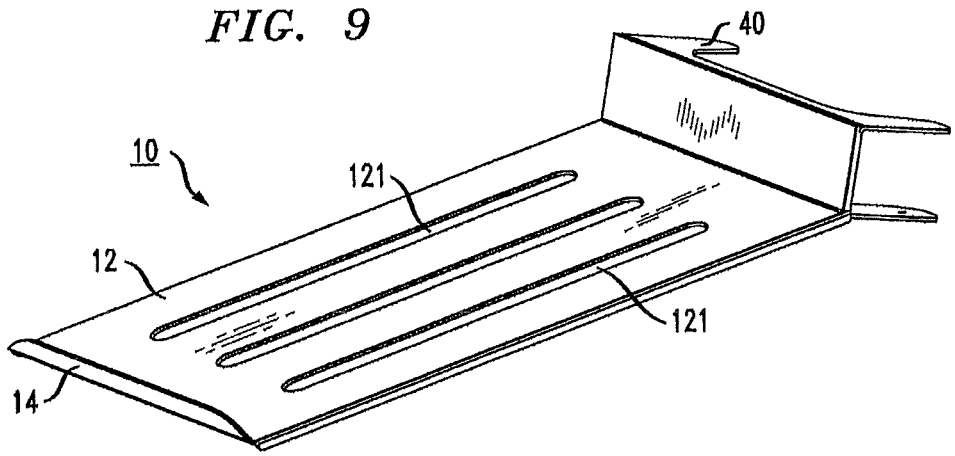
FIG. 9 illustrates an exemplary tray portion of the holder of the present invention, formed to include a plurality of ribs for additional rigidity.
Figure 10:
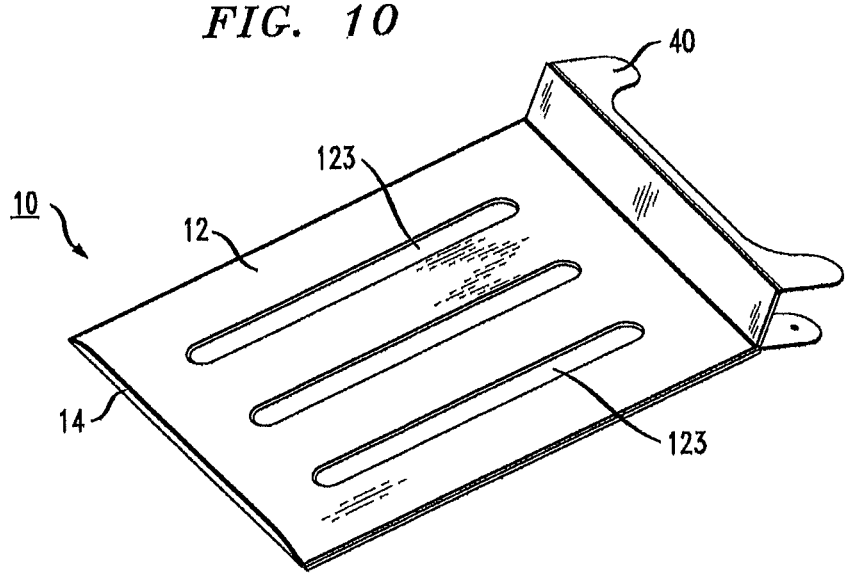
FIG. 10 illustrates another embodiment of a tray portion, in this case include a plurality of ventilation holes.

FIGS. 9-13 illustrate various alternative configurations for support tray 12, device retaining element 14 and upper end termination 16. FIG. 9 illustrates tray 12 and device retaining element 14 (in the form of a lower lip element 14), where in this case tray 12 has been particularly configured to include a plurality of ribs 121 that are considered to add rigidity to the structure. FIG. 10 shows an embodiment of tray 12 include a plurality of vent holes 123 (in this case, in the form of elongated openings) that may be incorporated with tray 12 to provide air circulation and provide overheating of a device positioned upon tray 12.

Figure 11:
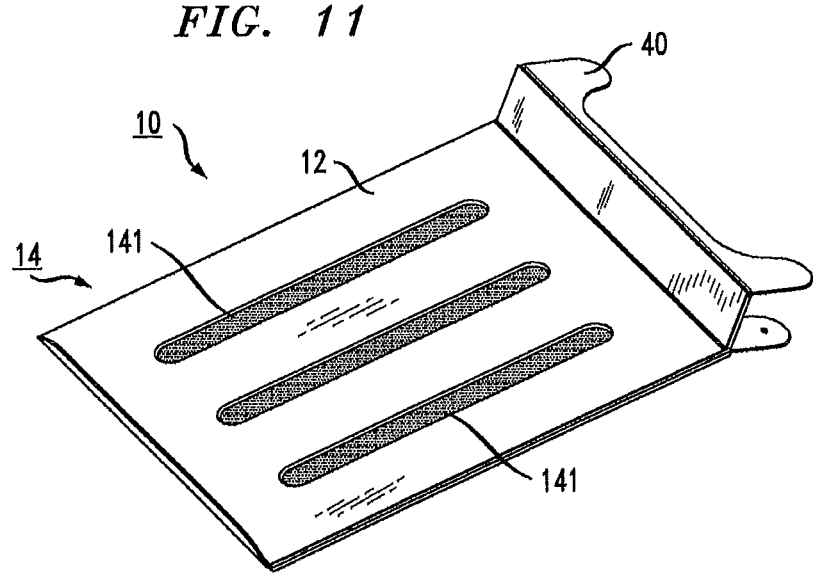
FIG. 11 illustrates a specific embodiment of the present invention where the device retaining element is formed as a plurality of non-stick strips attached to the top surface of the support tray.
Figure 12:
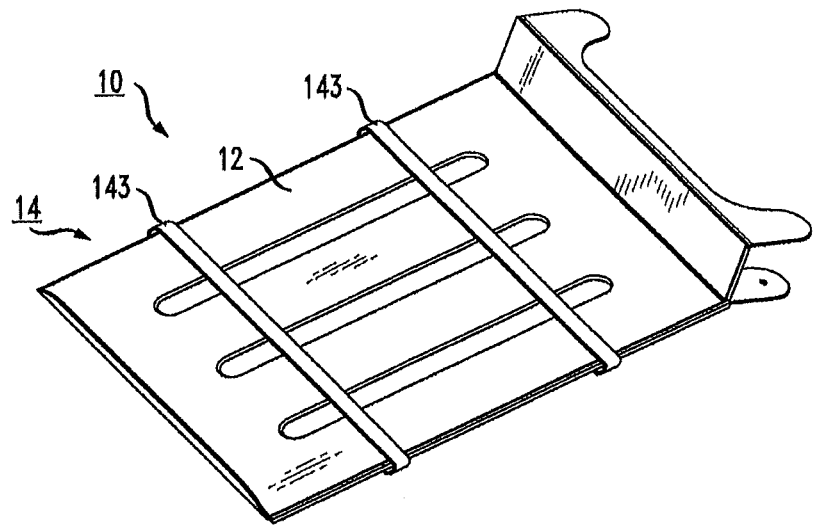
FIG. 12 shows an alternative embodiment of the present invention where the device retaining element comprises a pair of support straps that encircle the support tray and are used to hold a device in place.

FIG. 11 illustrates an alternative configuration of device retaining element 14, in this case in the form of a slip-resistant material 141 that is disposed over at least a portion of the upper surface of tray 12. The material is selected to provide sufficient frictional force to hold a device in place on tray 12. In this case, there is no lower lip termination included along tray 12. FIG. 12 shows yet another type of device retaining element 14, in this case comprising at least one strap 143 that is disposed around tray 12, strap 143 having a sufficient degree of elasticity to secure the device (such as a laptop) in place on tray 12. Again, there is no lower lip termination for this particular embodiment.

Figure 13:
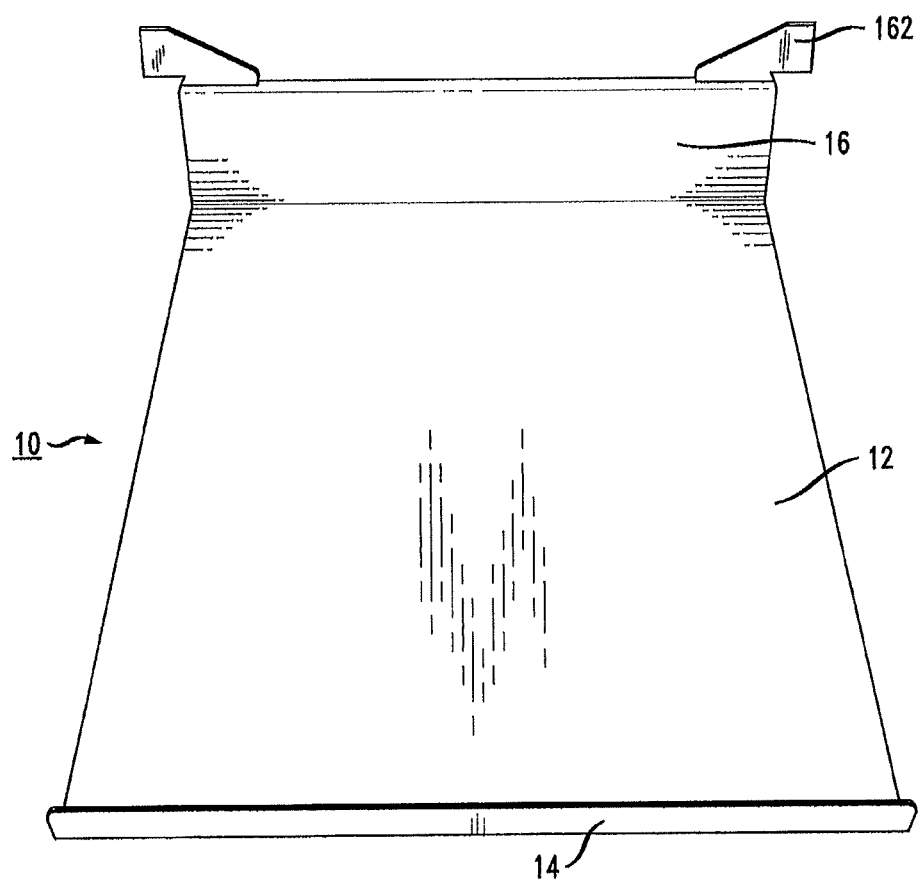
FIG. 13 illustrates an embodiment of the present invention where the upper end termination comprises a pair of corner brackets that engage with vertical wall portions of a cabinet (or other vertical wall elements) for supporting the portable holder in place.

FIG. 13 illustrates an alternative configuration of upper end termination 16, in this case comprising a pair of corner brackets 161, 162. Corner brackets are described in detail hereinbelow in association with other alternative embodiments of the invention. In each case, corner brackets rely on the availability of a shelf including a vertical support (such as a cabinet wall, bracing between adjacent shelves, or the like), where corner brackets 161, 162 engage the backside of the vertical supports to firmly attach holder 10 to shelf 20.

The embodiment as illustrated in FIGS. 1-13 comprises a portable holder 10 where tray 12, device retaining element 14 and upper end termination 16 are of (preferably) unitary construction—comprising either a rugged plastic material or a metal or composite, as appropriate. As mentioned above, it is also possible to form holder 10 of multiple components and, in this case, further possible to adjust both the width and length of the holder itself.

Figure 14:
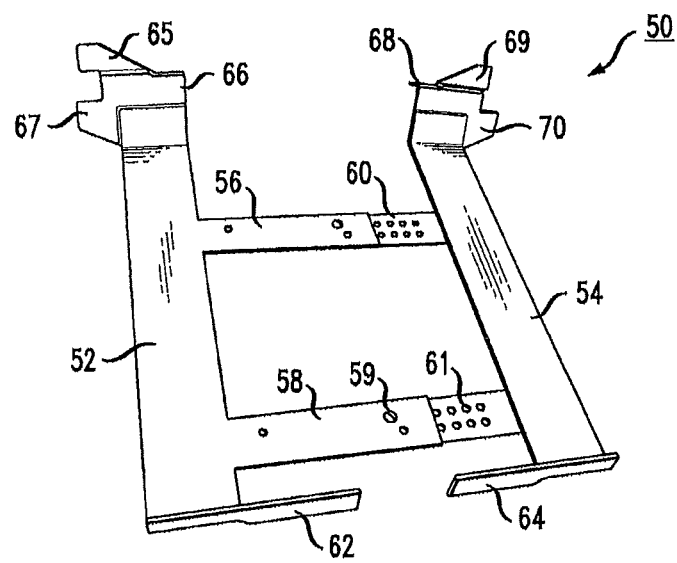
FIG. 14 is a view of an alternative embodiment of the present invention, in this case configured as a multi-component holder and capable of being adjusted in width, as desired by the user.
Figure 15:
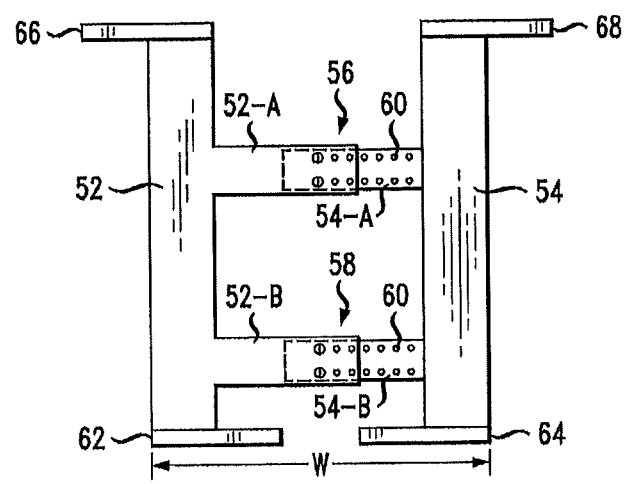
FIG. 15 is a front plan view of the alternative embodiment of FIG. 14.

FIG. 14 illustrates an alternative, multi-component embodiment of the present invention, shown as an adjustable, portable holder 50. In this embodiment, the support tray portion comprises a pair of side support members 52, 54 with at least one horizontal support bar 56 disposed therebetween. This arrangement allows for sufficient air flow around the laptop and prevents overheating. The specific embodiment of FIG. 14 includes a pair of horizontal support bars 56-1 and 56-2. FIG. 15 is a front, plan view of the multi-component embodiment of FIG. 14.

Referring to both FIGS. 14 and 15, the device retaining element of holder 50 is shown as comprising a pair of upwardcurving front stops 62, 64, with front stop 62 attached to a lower end of side support member 52 and front stop 64 attached to a lower end of side support member 54. For configurations where the width of holder 50 is adjustable, it is preferable to form device retaining element as separate segments so as to facilitate the ability to adjust the width of holder 50.

Indeed, in a preferred configuration of this multi-component embodiment, horizontal support bars are adjustable (using, for example, C-channel members with a plurality of sizing holes 60) to allow for the width W of holder 50 to be adjusted, as best shown in FIG. 15. In this particular arrangement, horizontal support bars 56 are formed as horizontal extensions of side support members 52 and 54. In particular, side support member 52 is formed to include horizontal portions 52-A and 52-B. Similarly, side support member 54 is formed to include horizontal portions 54-A and 54-B. Horizontal portions 52-A and 52-B are formed as, for example, C-channel elements, that allow for horizontal portions 54-A and 54-B to slide within the interiors thereof (indicated in phantom in FIG. 8). Horizontal portions 54-A and 54-B are shown as formed to include a plurality of sizing holes 60, which align with alignment holes 58 in horizontal portions 52-A and 52-B. Once the desired width W of holder 50 is found, fixing pegs 59 are positioned through holes 58, 60 to secure the horizontal width of holder 50. Other arrangements maybe used besides fixing pegs and sizing holes to provide and fix the width adjustment of holder 50. For example, a clamping mechanism may be used. Moreover, while a pair of horizontal support bars 56-1, 56-2 is shown in FIGS. 14 and 15, it is to be understood that any other suitable number of horizontal support bars (including a single support bar) may be used and fall within the scope of this invention.

Figure 16:
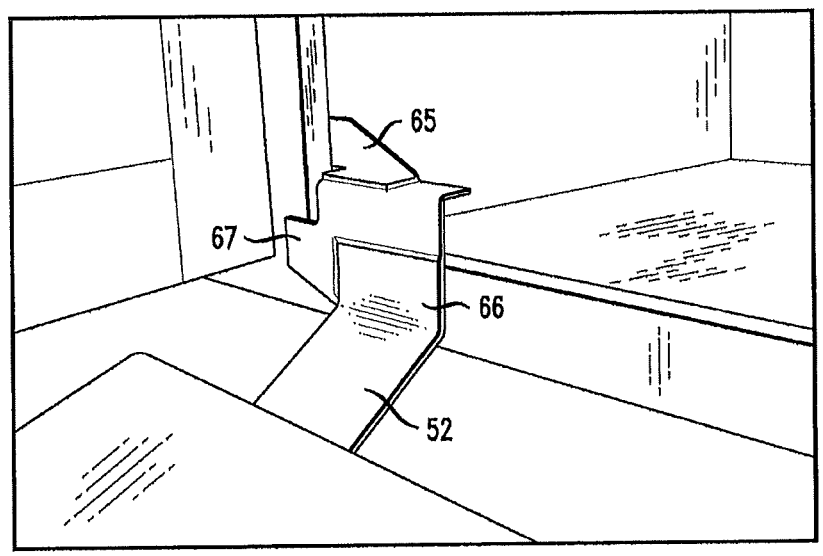
FIG. 16 is an enlarged view of the attachment means associated with the alternative embodiment of FIG. 14.

As best shown in FIGS. 14 and 16, attachment means 18 of multi-component portable holder 50 comprises a pair of support brackets 66 and 68 that are used to couple holder 10 to shelf 20 of wall-mounted cabinet 22 (it is to be understood that a pair of bolts as described above may alternatively be used in this embodiment). Bracket 66 includes an upper bracket piece 65 that fits behind left-hand sidewall 26 of cabinet 22. Bracket 68 similarly includes an upper bracket piece 69 that fits behind right-hand sidewall 26 of cabinet 22. By using bracket pieces 65 and 69 to engage sidewalls 26, holder 50 is held fixedly in place with respect to cabinet 22. Front brace members 67 and 70 are also included in brackets 66, 68 and are positioned against the front face of shelf 20. This arrangement is more than sufficient to securely hold a laptop in place.

FIG. 16 is an enlarged view of the engagement of support bracket 66 with the left-hand sidewall 26 of cabinet 22. The positioning of upper bracket piece 65 behind sidewall 26 is clearly evident in this view, as is the positioning of front brace member against the front face of shelf 20.

Figure 17:
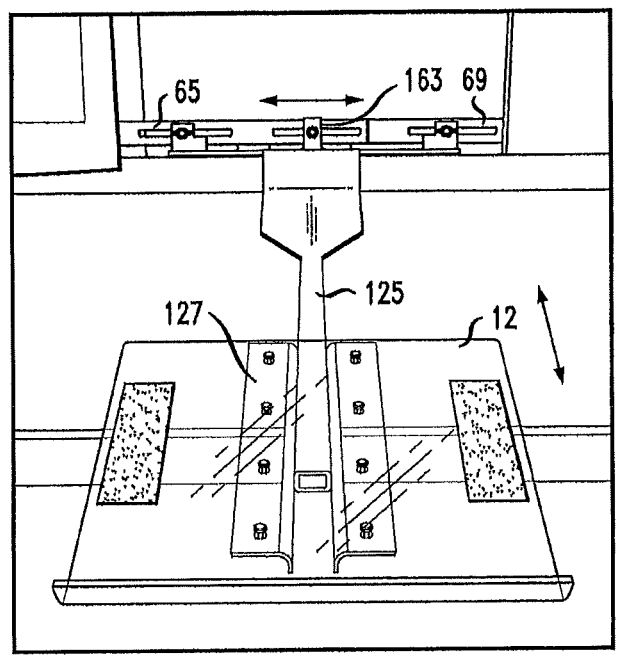
FIG. 17 is a front view of an yet another embodiment of the present invention, in this case comprising a support tray portion that is adjustable in length and an upper termination component that is adjustable in width.
Figure 18:
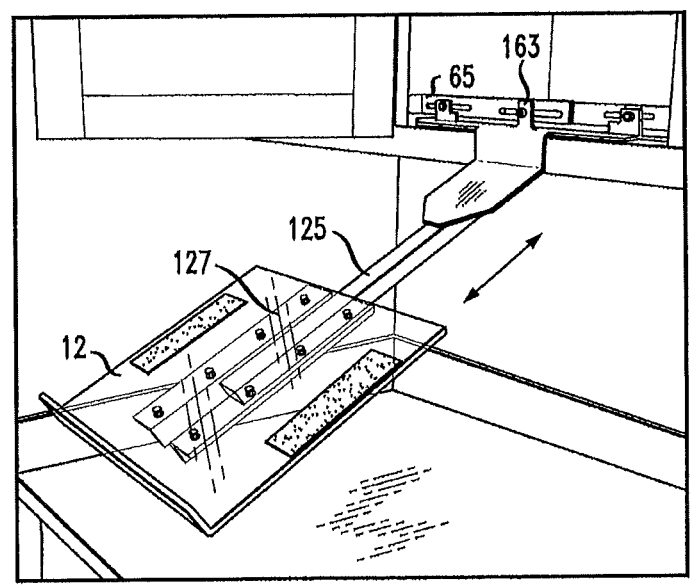
FIG. 18 is a side view of the embodiment of FIG. 17.

FIGS. 17 and 18 illustrate an alternative adjustable portable holder 80 formed in accordance with the present invention. In this embodiment, both the length of support tray 12 and the width of upper end termination 16 are adjustable. In particular, support tray 12 is shown as being supported by a central adjusting bar 125, with tray 12 including a slide rail 127 formed on the underside thereof that engages adjusting bar 125 to allow for tray 12 to be moved vertically with respect to upper end termination 16 (as shown by the double-ended arrow in FIGS. 17 and 18). Upper end termination 16 is itself adjustable in width, so as to accommodate cabinets of differently sized openings. In this case, upper end termination 16 includes an adjustable member 163, with upper bracket pieces 65 and 69 attached to opposing ends thereof. Adjustable member 163 includes telescoping apparatus that allows for bracket pieces 65, 69 to be moved "in" and "out" until both engage cabinet walls. Once engagement is secured, a locking component is used to hold adjustable member 163 in place.

While the embodiments as described above are particularly well-suited for use with a standard-sized laptop computer, as the overall size of electronic devices continues to shrink (such as, for example, tablets, e-readers, cell phones, and the like), other embodiments have been developed that provide additional features that may be of particular benefit for these small devices. In particular, and as will be discussed below, these features include (but are not limited to) being able to modify the viewing angle for a particular device (and also modify the viewing angle for a particular orientation of a device), as well as pivoting the entire holder to a preferred location. These features are provided without compromising the portability of the holder itself, or compromising the means used for attaching the holder to a shelf or other location.

Figure 19:
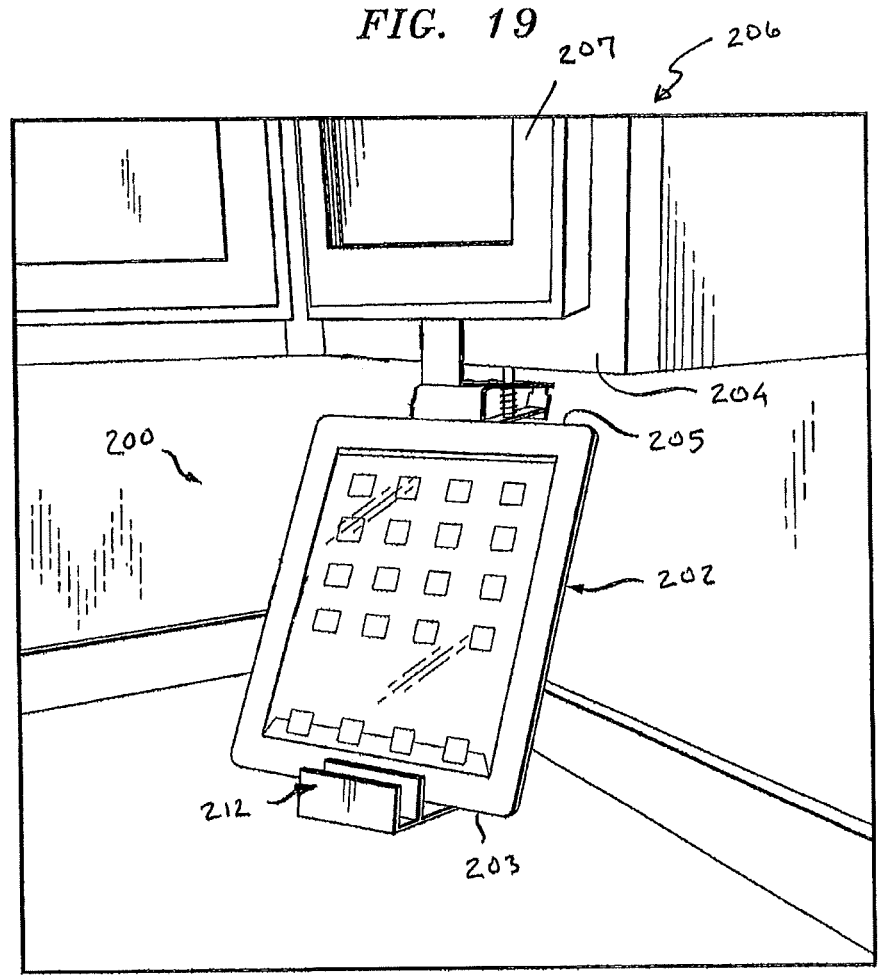
FIG. 19 is an isometric view of an alternative embodiment of the present invention that is particularly well-suited for use with relatively small electronic devices.
Figure 20:
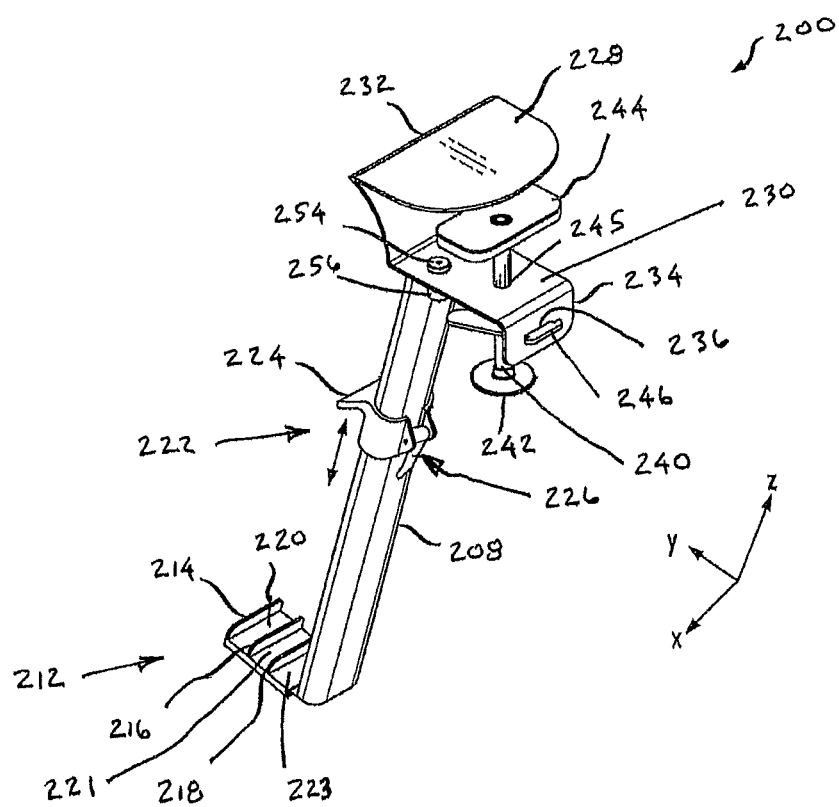
FIG. 20 is an isometric rear view of the device holder of FIG. 19.
Figure 21:
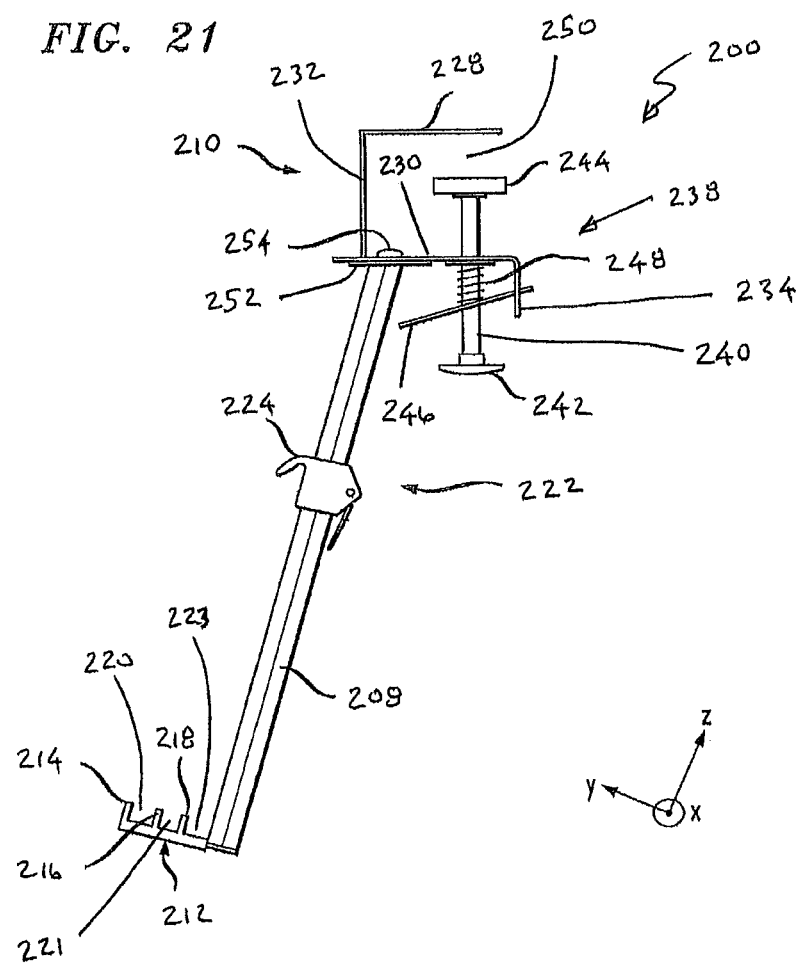
FIG. 21 is a side view of the device holder of FIG. 20.

Referring now to FIGS. 19-21, a further embodiment of a device holder 200 according to this invention is shown mounting a tablet 202 to the bottom panel 204 of a cabinet 206 having a door 207. It should be understood that essentially any other electronic device of a size about the same as or smaller than the tablet 202 may be supported by the device holder 200, and the device holder 200 may be mounted to essentially any generally horizontally oriented panel in a manner discussed below. As such, the tablet 202 and cabinet 206 are shown in the Figs. for purposes of illustration only.

As best seen in FIGS. 20 and 21, the device holder 200 comprises a post 208 and a mounting bracket 210. The post 208 has an upper end connected to the mounting bracket 210 as discussed below, and a lower end connected to a base support 212. For purposes of the present discussion, the term "upper," "lower," "top," "bottom," "upwardly" and "downwardly" refer to the orientation of the device holder 200 as depicted in the Figs. In the preferred embodiment, the base support 212 has three upstanding ribs 214, 216 and 218 which are spaced from one another forming channels 220 and 221 between them. A third channel 223 is formed between the rib 218 and post 208. The length of the base support 212, and the number of ribs 214-218 and channels 220, 221, 223, may be varied as desired. A top support 222 faulted with an outwardly extending finger 224 is located on the post 208 in between its upper and lower ends. The top support 222 includes a cam lock 226 which is movable between a locked position in which the top support is releasably fixed to the post 208, and an unlocked position wherein the top support 222 may be moved to any desired position between the upper and lower ends of the post 208. As shown in FIG. 19, the bottom end 203 of the tablet 202 may rest within anyone of the channels 220, 221 or 223 in base support 212 and its top end 205 is retained on the top support 222 by finger 224. Since the top support 222 is movable along the post 208, electronic devices of different heights are readily accommodated by the device holder 200 of this invention.

The mounting bracket 210 comprises a top plate 228, a bottom plate 230 and a side plate 232 connected substantially perpendicularly to and in between the top and bottom plates 228, 230 forming a structure in the general shape of a "C." A downwardly extending lip 234 is connected to or integrally formed with the bottom plate 230 at substantially a right angle thereto. The lip 234 is formed with a slot 236 for purposes to become apparent below. The mounting bracket 210 further includes a plunger 238 comprising a rod 240 with a head section 242 at its lower end and a pad 244 mounted to its upper end. The rod 240 extends through a bore 245 in the bottom plate 230 of mounting bracket 210 such that the pad 244 faces and is oriented generally parallel to the top plate 228.

In the presently preferred embodiment, a locking lever 246 is mounted within the slot 236 formed in the lip 234 and has a bore 247 that receives the rod 240 of plunger 238. See FIG. 23. A coil spring 248 extends between the locking lever 246 and the bottom plate 230 of mounting bracket 210. In the locked position depicted in FIG. 21, the locking lever 246 is oriented at an angle relative to the bottom plate 230 as a result of the spring force exerted by the coil spring 248. The rod 240 engages an edge of the bore 247 in locking lever 246 to retain it, and the plunger 238, in the vertical position shown in FIG. 21 wherein a space 250 is provided between the pad 244 and bottom surface of top plate 228. In order to vary the height dimension of space 250, and ensure that a horizontal panel of given thickness is firmly engaged between the top plate 228 and pad 244, the locking lever 246 may be pivoted upwardly toward the bottom plate 230 of mounting bracket 210 to an unlocked position thus allowing the rod 240 to slide upwardly or downwardly within the bore 245 in bottom plate 230 and within the bore 247 in locking lever 246. Once in the desired position, with the panel sandwiched between the top plate 228 and pad 244, the locking lever 246 may be released and the coil spring 248 then returns the locking lever 246 to its angled, locked position. As illustrated in FIG. 21, the bottom panel 204 of cabinet 206 may be received within the space 250 between the pad 244 and bottom surface of top plate 228. Preferably, the top plate 228 has a thickness such that the door 207 of cabinet 206 may be closed when the device holder 200 is mounted thereto.

Figure 22:
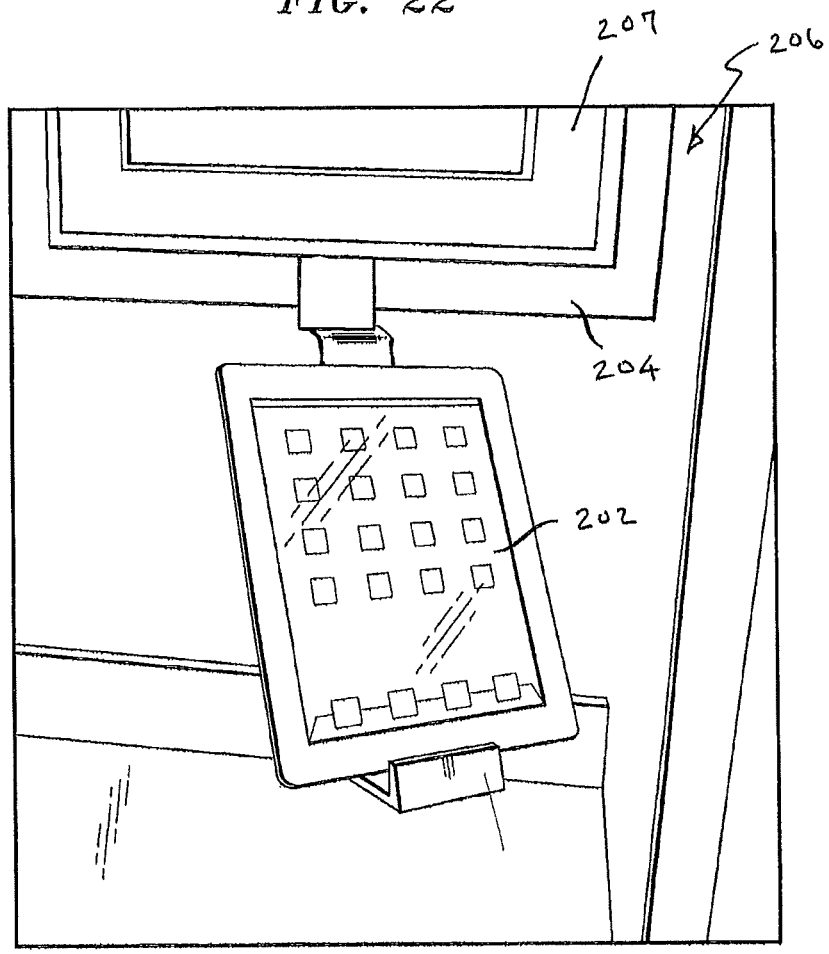
FIG. 22 is another isometric view of the same arrangement as shown in FIG. 19, in this case with the central support member of the holder rotated with respect to the cabinet shelf upon which it is mounted.

As shown in FIGS. 21 and 22, the upper end of post 208 mounts an end plate 252 which is oriented at an angle relative to the post 208. The end plate 252 of post 208 is connected to the bottom plate 230 of mounting bracket 210 by a bolt 254 and nut 256 which are not tightened down but permit relative pivotal movement of the post 208 with respect to the mounting bracket 210. It should be understood, that any other pivotal connection between the post 208 and mounting bracket 210 may be employed, and the nut-and-bolt arrangement shown in the Figs. is for purposes of illustration only. It can be appreciated from FIG. 21 that when the mounting bracket 210 is mounted to a horizontally oriented panel, the post 208 is angled relative to such panel, which, in turn, disposes the tablet 202 or other electronic device carried by the post 208 at the same angle. Additionally, the angle at which the tablet 202 is oriented may be varied by placing its bottom edge 203 in a different channel 220, 221, or 223. Such angulation of the post 208 helps avoid glare and makes it easier to view and operate the tablet 202.

Figure 23:
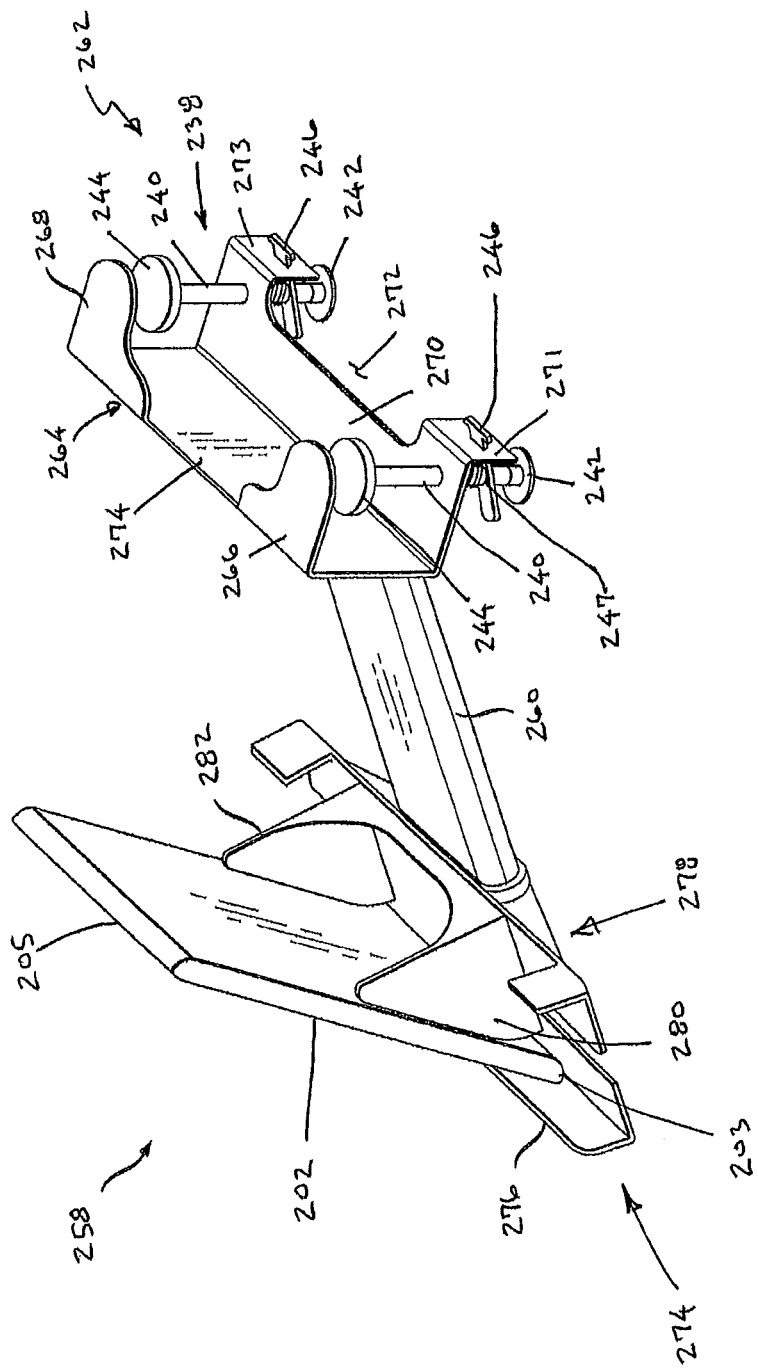
FIG. 23 is an isometric view of yet another embodiment of the present invention, in this case using an adjustable viewing element that slides along the central support member.
Figure 24:
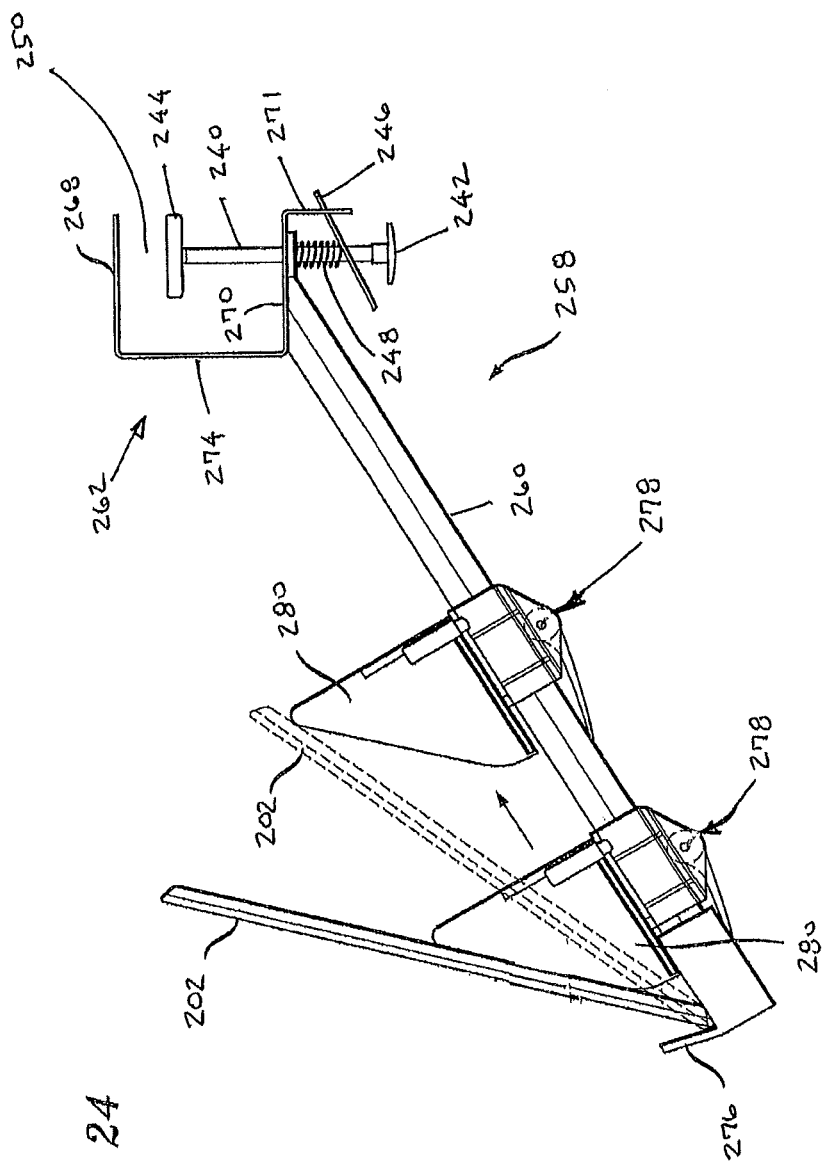
FIG. 24 is a side view of the embodiment of FIG. 23.

Referring now to FIGS. 22-24, a still further embodiment of a device holder 258 is shown for mounting a tablet 202 or other electronic device to the bottom panel 204 of cabinet 206 or other horizontally extending panel. The device holder 258 includes a post 260 pivotally mounted to a mounting bracket 262 such that the post 260 is oriented at an angle relative to the mounting bracket 262 as in the embodiment of FIGS. 19-21. The mounting bracket 262 is similar to mounting bracket 210 described above in connection with a discussion of FIGS. 19-21, except it has a top plate 264 segmented into two sections 266, 268, a bottom plate 270 formed with a cut-out area 272 and two downwardly extending lips 271, 273, and, a side plate 274 connected between the top and bottom plates 264, 270. Instead of a single plunger 238, the device holder 258 has two plungers 238 each carried by the bottom plate 270 which cooperate with one of the sections 266, 268 of the top plate 264 to clamp a horizontal panel between them in the same way as described above in connection with a discussion of FIGS. 19-21. As such, the same reference numbers are used to identify elements in FIGS. 22-24 which are common to those in FIGS. 19-21 as discussed in detail above.

The main difference between the device holders 200 and 258 is the manner in which a tablet 202 or other electronic device is carried by their respective posts 208, 260 and angled relative to the horizontal panel to which such device holders 200, 258 are mounted. In the embodiment of FIGS. 22-24, a base support in the form of an end cap 274 having a single elongated rib 276 is secured to the lower end of post 260 in position to receive and support the bottom end 203 of tablet 202 or other electronic device. A carriage 278 having spaced, tapered arms 280, 282 is movable to different locations along the post 260. As illustrated in FIG. 24, with the carriage 278 positioned closer to the end cap 274 the tablet 202 rests against the tapered arms 280, 282 at a relatively upright angle compared to when the carriage 278 is moved further away from the end cap 274 and the tablet 202 rests against an outer edge of each arm 280, 282.

Although the specification above necessarily includes numerous specificities, these should be construed as illustrating some of the possible embodiments and applications of the invention and not as limiting the scope thereof. For instance, the portable holder of the present invention may be formed of a variety of different materials, or any desired combination of materials, including plastics, metals, composites, wood, or the like. And while the holder has been generally conceived for the purpose of holding a laptop computer, it is equally suitable to support any type of communication or computing device in an out-of-the-way location, above a countertop and supported along a shelf of a wall-mounted cabinet. Therefore, the scope of the present invention should be determined solely by the appended claims and their legal equivalents rather than by the specific above-described embodiments.

What is claimed is:

1. Apparatus for mounting a portable device to a generally horizontally oriented support, comprising:
   a post having a first end and a second end;
   a mounting bracket including:
      (i) spaced first and second plates connected to one another by a third plate defining an opening within which the generally horizontally oriented support is received, said first end of said post being mounted to one of said first and second plates such that said post is oriented at an angle and pivotal relative to said one of said first and second plates;
      (ii) a plunger carried by said second plate of said mounting bracket and being movable relative to said first plate to different positions within said opening between said first and second plates;
      (iii) a locking lever extending between said plunger and said second plate, said locking lever being connected to said second plate, said locking lever being movable to a locked position in which it engages and retains said plunger in position within said opening so that the generally horizontally oriented support is sandwiched between said first plate and said plunger, said locking lever being movable to an unlocked position in which it disengages said plunger and allows said plunger to release the horizontally oriented support;
   a first device support having a first device-engaging element, said first device support being mounted to said post so that said first device-engaging element is in position to contact and support one portion of the portable device;
   a second device support having a second device-engaging element, said second device support being mounted to said post so that said second device-engaging element is in position to contact and support another portion of said portable device;

said first and second device supports being mounted to said post in positions relative to one another such that their respective first and second device-engaging elements secure the portable device between said first end and said second end of said post.

2. The apparatus of claim 1 in which said first device-engaging element is a plate formed with at least two upright ribs defining a channel between them, said one portion of the portable device being supported within said channel.

3. The apparatus of claim 1 in which said second device-engaging element is a finger extending from said second device support, said finger being effective to contact and support said another portion of said portable device.

4. The apparatus of claim 1 in which at least one plunger includes a rod extending through a bore formed in said second plate, said rod having a head section at one end and a pad at an opposite end which is oriented generally parallel to said first plate of said mounting bracket in position to engage the generally horizontally oriented support.

5. The apparatus of claim 1 in which the generally horizontally oriented support is the bottom panel of a cabinet having a door movable between open and closed positions, the bottom panel being received between said first and second plates of said mounting bracket with said top plate resting atop said bottom panel in position to permit the door of the cabinet to be moved to a closed position.

6. Apparatus for mounting a portable device to a generally horizontally oriented support, comprising:
   a post having a first end and a second end;
   a mounting bracket including:
   (i) spaced first and second plates connected to one another by a third plate defining an opening within which the generally horizontally oriented support is received, said first end of said post being mounted to one of said first and second plates such that said post is oriented at an angle and pivotal relative to said one of said first and second plates;
   (ii) a plunger carried by said second plate of said mounting bracket and being movable relative to said first plate to different positions within said opening between said first and second plates;
   (iii) a locking lever extending between said plunger and said second plate, said locking lever being connected to said second plate, said locking lever being movable to a locked position in which it engages and retains said plunger in position within said opening so that the generally horizontally oriented support is sandwiched between said first plate and said plunger, said locking lever being movable to an unlocked position in which it disengages said plunger and allows said plunger to release the horizontally oriented support;
   a first device support having a first device-engaging element, said first device support being mounted to said post so that said first device-engaging element is in position to contact and support one portion of the portable device;
   a second device support having a second device-engaging element, said second device support being mounted to said post so that said second device-engaging element is in position to contact and support another portion of said portable device;
   said first and second device supports being mounted to said post in positions relative to one another such that their respective first and second device-engaging elements secure the portable device between said first end and said second end of said post;
   at least one of said first and second device supports begin movable along said post toward and away from the other of said first and second device supports to accommodate portable devices of different dimension.

7. The apparatus of claim 6 in which said second device support includes a cam lock, said cam lock being movable between a locked position in which said second device support is clamped in a fixed position along said post and an unlocked position in which said second device support may be moved along said post toward and away from said first device support.

8. Apparatus for mounting a portable device to a generally horizontally oriented support, comprising:
   a post having a first end and a second end;
   a mounting bracket including:
   (i) spaced first and second plates connected to one another by a third plate defining an opening within which the generally horizontally oriented support is received, said first end of said post being mounted to one of said first and second plates such that said post is oriented at an angle and pivotal relative to said one of said first and second plates;
   (ii) a plunger carried by said second plate of said mounting bracket and being movable relative to said first plate to different positions within said opening between said first and second plates, said plunger including a rod;
   (iii) a locking lever extending between said plunger and said second plate, a spring extending along said rod of said plunger between said second plate and said locking lever, said locking lever being movable to a locked position in which said spring urges said locking lever into engagement with said rod so that the generally horizontally oriented support is sandwiched between said first plate and said plunger, said locking lever being movable to an unlocked position in which it disengages said rod and allows said plunger to release the horizontally oriented support;
   a first device support having a first device-engaging element, said first device support being mounted to said post so that said first device-engaging element is in position to contact and support a portion of the portable device;
   a second device support having a second device-engaging element, said second device support being mounted to said post so that said second device-engaging element is in position to contact and support another portion of said portable device;
   said first and second device supports being mounted to said post in positions relative to one another such that their respective first and second device-engaging elements secure the portable device between said first end and said second end of said post.

* * * * *